United States Patent [19]
Stern

[11] Patent Number: 6,091,017
[45] Date of Patent: Jul. 18, 2000

[54] SOLAR CONCENTRATOR ARRAY

[75] Inventor: Theodore G. Stern, El Cajon, Calif.

[73] Assignee: Composite Optics Incorporated, San Diego, Calif.

[21] Appl. No.: 09/379,254

[22] Filed: Aug. 23, 1999

[51] Int. Cl.$^7$ .................................................. H01L 25/00
[52] U.S. Cl. ..................... 136/246; 136/244; 136/259; 126/698
[58] Field of Search .................... 136/244, 248, 136/246, 245, 292, 293, 259, 256; 126/698

[56] References Cited

U.S. PATENT DOCUMENTS

| | | | |
|---|---|---|---|
| 4,055,442 | 10/1977 | Crosher | 136/89 |
| 4,088,121 | 5/1978 | Lapeyre | 126/271 |
| 4,248,643 | 2/1981 | Peters | 136/248 |
| 4,454,371 | 6/1984 | Folino | 136/246 |
| 4,714,510 | 12/1987 | Holt | 437/2 |
| 5,131,955 | 7/1992 | Stern et al. | 136/245 |
| 5,145,777 | 9/1992 | Blackmon et al. | 136/245 |
| 5,180,441 | 1/1993 | Cornwall et al. | 136/246 |
| 5,538,563 | 7/1996 | Finkl | 136/246 |
| 5,665,174 | 9/1997 | Laing et al. | 136/246 |
| 5,709,456 | 1/1998 | Smith et al. | 362/84 |
| 5,912,777 | 6/1999 | Jaworske | 359/883 |
| 5,919,316 | 7/1999 | Bogorad et al. | 136/256 |
| 5,948,175 | 9/1999 | Glenn | 136/244 |
| 5,959,787 | 9/1999 | Fairbanks | 359/726 |

*Primary Examiner*—Nam Nguyen
*Assistant Examiner*—Michael Miggins
*Attorney, Agent, or Firm*—Frank D. Gilliam

[57] ABSTRACT

A high efficiency, light weight solar concentrator array particularly suitable for use with space vehicles. Parallel rows of mirror assemblies are mounted on a base plate having high thermal conductivity. Each mirror assembly comprises back-to-back mirror strips having reflecting front faces. Photovoltaic cells are placed ion the base plate between rows of mirror assemblies. The reflecting faces reflect incident light to the photovoltaic cells to produce electric power. Preferably, the reflecting faces have a cylindrical parabolic configuration with a line of focus approximately along the interface between the photovoltaic cell and the edge of the opposite mirror strip adjacent to the cell. The mirror strips may typically be roll formed from metal strips, cast from fiber reinforced plastic material and coated with a reflecting layers, etc. The rows may be mounted on the base plate by strips across the ends of mirror assemblies, or by additional mirror assemblies arranged transverse to the original mirror assembles.

15 Claims, 2 Drawing Sheets

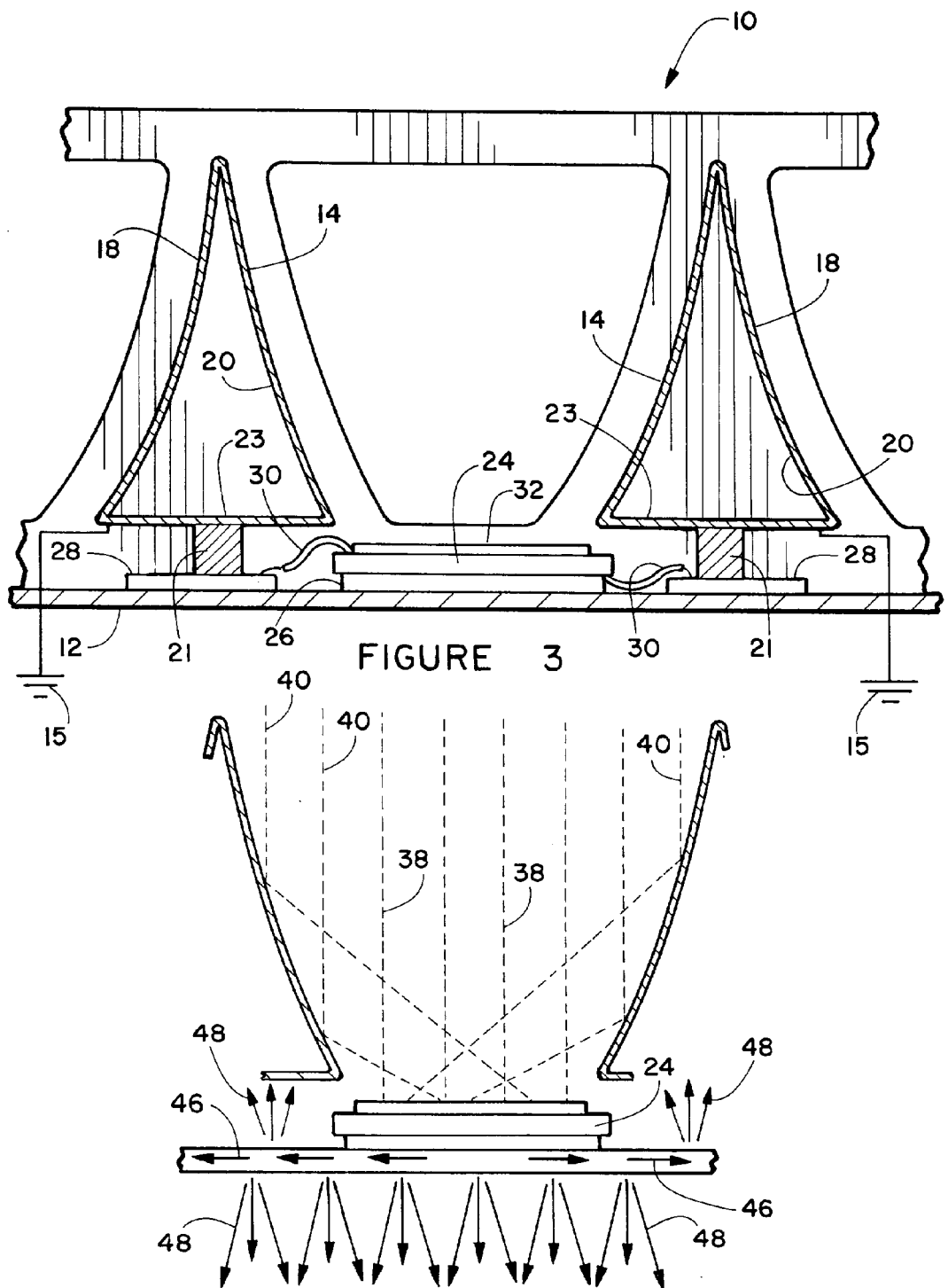

SOLAR CONCENTRATOR ARRAY

FIELD OF THE INVENTION

This invention relates to apparatus for converting solar energy into electrical energy and, more particularly, photovoltaic devices for directly connecting sunlight into electricity.

BACKGROUND OF THE INVENTION

A number of different photovoltaic devices have been developed for producing electrical power both for both terrestrial and space applications. Space craft have a need for high levels of reliable electrical power over very long periods. For space applications, the photovoltaic device must be highly efficient, light in weight, sufficiently sturdy to withstand launch forces and resistant to degradation from the space environment of proton and electron impact and electrostatic effects.

Most photovoltaic apparatus presently used with space vehicles utilize large planar photovoltaic cell arrays that extend from sides of a support structure. These arrays are generally folded for launch, then are unfolded for deployment in space. They tend to be undesirably heavy and to require complex deployment arrangements. The many photovoltaic cells that make up the arrays are expensive and fully exposed to degradation from radiation, particles, etc. Electrically conductive circuitry associated with those cells is also exposed to the ambient space environment, providing opportunities for disadvantageous charge buildup, discharge and leakage currents.

Photovoltaic panels have been developed using strip reflectors of different types. Typical such panels include a plurality of spaced strip reflectors to reflect sunlight to photovoltaic cells. While quite effective, these prior panels lack the desired high regidity, efficiency and resistance to electrons, protons, electrostatic effects, etc.

Therefore, there is a continuing need for large photovoltaic panels for use in space applications that have higher efficiency, maximize the number and total area of photovoltaic cells per watt of electrical output greater rigidity over a large panel and that provide greater protection for the photovoltaic cells from degradation due to electromagnetic and particle irradiation and electrostatic effects.

SUMMARY OF THE INVENTION

The above noted problems, and others, are overcome in accordance with this invention by a solar concentrator array which, basically, comprises a base plate formed from material having high thermal conductivity, a main mirror array comprising a plurality of upstanding parallel spaced mirrors, in pairs having highly reflective juxtaposed opposed faces, and photovoltaic cells mounted on the base plate between the spaced mirror units to receive solar radiation both directly and by reflection from the mirror faces.

The mirrors preferably have parabolic reflecting surfaces, with the focus of each mirror at the line where an edge of the opposed mirror meets the photovoltaic cell in order to direct the maximum proportion of the incident light to the cells. Alternatively, the mirrors may use a cylindrical shape that closely conforms to the optimum parabolic shape. The mirrors may be formed from any suitable material, as individual mirror strips positioned together in a back-to-back arrangement or conformed with both of the contiguous (back-to-back) mirrors formed at the same time. Since light weight is important, it is preferred the formed strips be as thin as consistent with the required strength and efficiency.

In one preferred embodiment, end mounts at the ends of each series of mirror pairs are secured to the mirrors ends and to the base plate. The end mounts may be thin sheet material, cut away where appropriate to reduce weight. Alternatively, the mirror mounts may be additional parabolic mirror pairs, inserted or formed transverse to the main parallel mirror array and having ends cut or formed to match the curvature of the main parallel reflector array with at least some of the mirror pairs bonded to the base plate to form a mirror grid with pockets between main and support mirror pairs. This embodiment may be manufactured by casting the mirror grid in a corresponding mold, then applying a reflective material to the mirror faces. In this embodiment, the photovoltaic cells are rectangular in shape to fit in each pocket of the grid. Alternatively, mirror strips with slots can be assembled in an "egg crate" configuration.

Each photovoltaic cell is bonded to the base plate in a conventional manner that assures good heat transfer from the cell to the base plate. A transparent cover slide is preferably bonded over each photovoltaic cell. Conventional wiring on or in base plate is provided to receive electrical energy from the photovoltaic cells and deliver the energy to the spacecraft bus. Wiring patterns bonded to the base plate in the manner of printed circuit boards are preferred, with wires connecting each photovoltaic cell to pads on the printed wiring.

This arrangement of mirrors in front of the photovoltaic cell array provides shielding against electrons and protons coming in at off-axis angles and also provides a grounded structure that surrounds the cells, thereby limiting electrical interaction.

It is, therefore, an object of this invention to provide a high efficiency solar concentrator array for use with space vehicles.

Another object is to provide a solar concentrator array that is resistant to degradation from particle (including electrons, protons, etc.) impact.

A further object is to provide solar concentrator array base structure that both supports the array and acts as a heat radiator, avoiding the need for a separate radiator.

Yet another object is to provide a solar concentrator array using fewer and smaller photovoltaic cells to improve efficiency, lower weight and lower cost.

Still another object is to provide a solar concentrator array which inherently shields the photovoltaic cells from electrical fields, electrostatic charge buildup and discharge, and leakage currents.

A further object is to provide a solar concentrator array with a mirror grid that provides a rigid structure to enhance the structural qualities of the overall solar panel.

BRIEF DESCRIPTION OF THE DRAWING

Details of the invention and of preferred embodiments thereof will be further understood upon reference to the drawing, wherein:

FIG. 3 is schematic section view through two adjacent mirror assemblies, taken on line 3—3 in FIG. 1; and FIG. 4 is a schematic representation of the light ray paths and heat flow in the array.

DETAILED DESCRIPTION OF PREFERRED EMBODIMENTS

Figure 1:
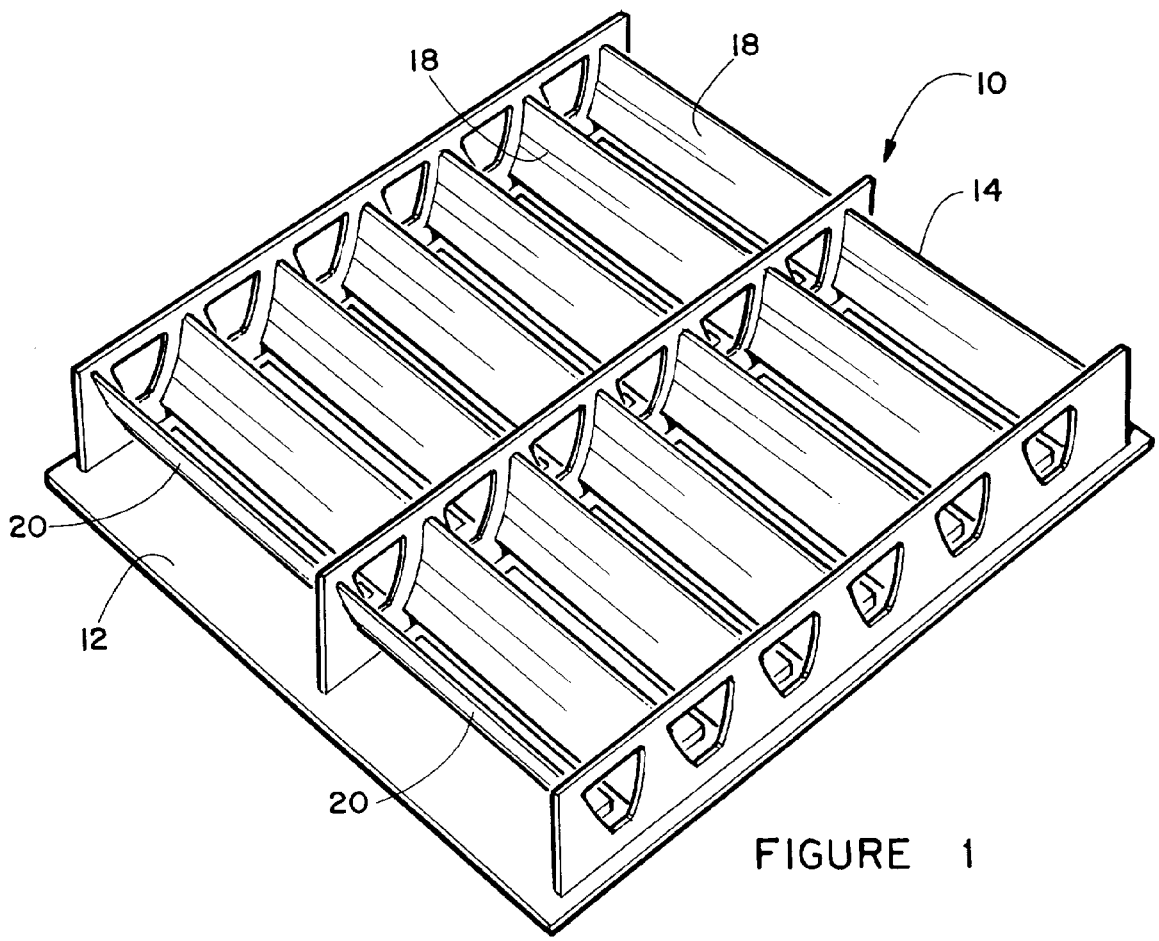
FIG. 1 is a schematic perspective view of a solar concentrator array according to this invention.

Referring to FIG. 1, there is seen a solar concentrator array 10 including a base plate 12, a plurality of mirrors 14 with mirror supports 16 bonded to the ends of mirrors 14 and base plate 12. For lightest weight, mirror supports are cut away between areas bonded to mirrors and to the base plate.

Each of mirrors 14 has a reflecting face 18 and a back surface 20. Mirrors 14 are arranged in a parallel array of mirror reflecting surface pairs, with reflecting faces of each pair juxtaposed. The mirror faces reflect light toward a photovoltaic cell (not seen in FIG. 1, but detailed in FIGS. 3 and 4). The configuration of mirrors 14 is detailed in conjunction with the description of FIGS. 3 and 4, below.

Figure 2:
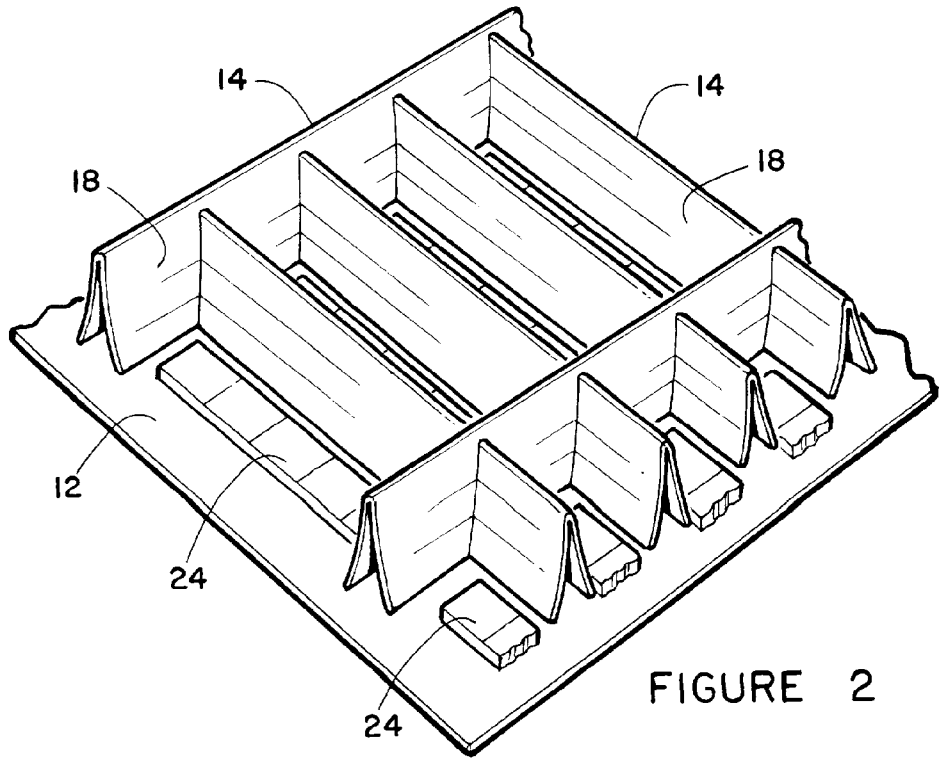
FIG. 2 is a detail perspective view of the solar concentrator array showing an alternative transverse support arrangement.

In an alternate embodiment as shown in a schematic detail view in FIG. 2, the supports are not flat panels as shown in FIG. 1 but instead are additional pairs of mirrors 22 having a configuration identical to mirrors 14, but having ends shaped to conform to the shape of reflecting surfaces 18. In this embodiment the supports also reflect light toward photovoltaic cells as seen in FIGS. 3 and 4.

Alternatively, The configuration of FIG. 2 may have a support means corresponding to the grid of ribs 21 and flat components 23 as seen in FIG. 3, discussed below.

While the grid of intersecting mirrors 14 seen in FIG. 2 may be formed from shaped metal strips, then cut to fit and bonded to the main mirrors, this embodiment is particularly adapted to manufacture by casting a composite material, such as a fiber reinforced plastic, against a corresponding mold, then applying the reflecting surface.

Referring now to FIG. 3, photovoltaic cells 24 are mounted onto baseplate 12 by a bonding layer 26 formed from any conventional bonding agent used with photovoltaic cells. Wiring 28, preferably a printed circuit on base plate 12, is connected to photovoltaic cells 24 by wires 30. A thin cover glass 32 is preferably mounted over photovoltaic cell 24. Pairs of facing mirrors 14 are supported on base plate 12 via electrically insulating support members made up of a grid of ribs 21 each carrying a flat grid 23 which is secured to the correspondingly sized grid of mirrors 14. Ribs 21 are sized to space flat grid 23 a predetermined distance above printed circuit board 28. Rib grid 21 is bonded to circuit board 28 or, if other wiring is selected, to base 12 with wires run through any suitable openings (not shown) in the ribs.

Mirrors 14 may have any suitable configuration that will direct incident radiation toward photovoltaic cell 24. For optimum efficiency, a parabola with its focus approximately along the line where an edge of a photovoltaic cell and the adjacent mirror edge meet (or nearly meet). Mirrors 14 are electrically grounded as schematically indicated by symbol 15 to provide an electrically grounded shielding enclosure substantially surrounding photovoltaic cells 24.

Mirrors 14 may be manufactured in any suitable manner. Composite mirrors may be made by replication of a mirror surface master on a graphite fiber reinforced composite laminate. Metal mirrors may typically be fabricated by conventional methods such as roll-forming, slip rolling, machining and electroforming with subsequent polishing or coating to achieve a highly reflective surface. Both of two back-to-back mirrors may be made as one structure by conventional cold molding or casting methods. Mirrors can be fabricated individually or in large sheets and subsequently stamped, machined or otherwise cut and formed to the proper strip geometry. The array has high rigidity with the parallel rows bonded to support members on the base plate or with additional transverse mirrors as detailed above.

FIG. 4 illustrates the direction of solar radiation to photovoltaic cell 24. Central rays 38 pass directly to photovoltaic cell 24 while light rays 40 outside the central cell area are reflected to the cell. This increases system efficiency, allows the use of narrower photovoltaic cells and protects the cells from particles, etc., directed at angle to the array as indicated by ray 42 which would damage or destroy a conventional flat photocell array. Further, light from a source that is not on a line perpendicular to the array so that little or no light will directly reach the photovoltaic cells will still generate electricity from rays that reach the mirrors and be reflected to the cells.

Meanwhile, heat generated in photovoltaic cells 24 will pass to highly thermally conductive base plate 12, pass along plate 12 as indicated by arrows 46 and be radiated into space as schematically indicated by rays 48. No additional heat radiator is required.

Other variations, applications and ramifications of this invention will occur to those skilled in the art upon reading this specification. Those are intended to be included with in the scope of this invention, as limited by the appended claims.

I claim:

1. A solar concentrator array, which comprises:
   a continuous, planar, base plate;
   said base plate being electrically conductive;
   a plurality of mirror strips each having a reflecting face and an opposite back surface;
   a plurality of electrically conductive mirror assemblies, each comprising contiguous back-to-back pairs of said mirror strips;
   support means for supporting said mirror assemblies in substantially parallel rows on said base plate with reflecting faces of each row toward reflecting faces of a next row and with a first edge of each strip adjacent to said base plate and a second edge of each strip extending away from said base plate;
   a photovoltaic cell secured to said base plate between adjacent mirror assemblies with photovoltaic cell edges approximately contiguous with said first edges of said adjacent mirror assemblies; and
   means for connecting said mirror assemblies and baseplate to an electrical ground.

2. The solar concentrator array according to claim 1 wherein each said reflecting face has an off-axis parabolic cylinder contour with a focal line approximately along strip first edges.

3. The solar concentrator array according to claim 2 wherein said mirror strips are formed from metal by roll forming.

4. The solar concentrator array according to claim 2 wherein said mirror strips comprise a composite material and on said reflecting face.

5. The solar concentrator array according to claim 1 further including a transparent protective cover over each said photovoltaic cell.

6. The solar concentrator array according to claim 1 wherein said photovoltaic cells are wired together in a predetermined relationship by electrically conducting lines formed on said base plate and each photovoltaic cell is connected to said lines by wires.

7. The solar concentrator array according to claim 1 wherein said support means comprises substantially flat plates secured to ends of said mirror strips and to said base plate, said support means lying substantially perpendicular to said base plate.

8. The solar concentrator array according to claim 1 wherein said support means comprises a plurality of additional mirror assemblies arranged transverse to, and intersecting, said parallel rows of mirror assemblies with at least some of said additional mirror assemblies secured to said base plate, each of said mirror assemblies and additional mirror assemblies having centerlines lying substantially perpendicular to said base plate.

9. A solar concentrator array, which comprises:

a continuous, planar, base plate formed from material with high thermal conductivity;

a plurality of electrically conductive mirror strips each having a reflecting face and an opposite back surface;

each said reflecting face having an off-axis parabolic cylinder contour with a focal line approximately along strip first edges;

a plurality of mirror assemblies, each comprising contiguous pairs of said mirror strips;

each of said mirror assemblies having an isosceles triangle configuration with a substantially flat base plate with two of said mirror strips as sides;

support means for supporting said mirror assemblies in substantially parallel rows on said base plate with a first edge of each strip adjacent to said base plate and a second edge of each strip extending away from said base plate;

a photovoltaic cell secured to said base plate between adjacent mirror assemblies with photovoltaic cell edges approximately contiguous with said strip first edges of said adjacent mirror assemblies; and means for connecting said mirror strips and base plate to an electrical ground.

10. The solar concentrator array according to claim 9 wherein said mirror strips comprise a metal.

11. The solar concentrator array according to claim 9 wherein said mirror strips comprise a composite material.

12. The solar concentrator array according to claim 9 further including a protective transparent cover over each said photovoltaic cell.

13. The solar concentrator array according to claim 9 wherein said photovoltaic cells are wired together in a predetermined relationship by conducting printed circuit lines formed on said base plate and each photovoltaic cell is connected to said lines by wires.

14. The solar concentrator array according to claim 9 wherein said support means comprises substantially flat plates secured to ends of said mirror strips and to said base plate.

15. The solar concentrator array according to claim 9 wherein said support means comprises a plurality of additional mirror assemblies arranged transverse to, and intersecting, said parallel rows of mirror assemblies and at least one of said additional mirror assemblies secured to said base plate, each of said mirror assemblies and additional mirror assemblies having a centerline lying substantially perpendicular to said base plate.

* * * * *